United States Patent [19]

Suzuki

[11] Patent Number: 5,627,627
[45] Date of Patent: May 6, 1997

[54] EXPOSURE CONTROL APPARATUS AND METHOD

[75] Inventor: Kazuaki Suzuki, Kawasaki, Japan

[73] Assignee: Nikon Corporation, Tokyo, Japan

[21] Appl. No.: 536,468

[22] Filed: Sep. 29, 1995

Related U.S. Application Data

[63] Continuation of Ser. No. 201,126, Feb. 24, 1994, abandoned.

[30] Foreign Application Priority Data

Feb. 24, 1993 [JP] Japan .................................. 5-035248

[51] Int. Cl.⁶ .................................................. G03B 27/52
[52] U.S. Cl. .................... 355/68; 355/53; 355/67; 355/71
[58] Field of Search .......................... 355/53, 67, 68, 355/71

[56] References Cited

U.S. PATENT DOCUMENTS

| | | | |
|---|---|---|---|
| Re. 33,931 | 5/1992 | Whitney | 355/53 |
| 4,624,551 | 11/1986 | Anzai et al. | 355/53 |
| 4,819,033 | 4/1989 | Yoshitake et al. | 355/53 |
| 4,924,257 | 5/1990 | Jain | 355/53 |
| 4,970,546 | 11/1990 | Suzuki et al. | 355/53 |
| 4,970,576 | 11/1990 | Suzuki et al. | 3/355 |
| 5,097,291 | 3/1992 | Suzuki | 355/69 |
| 5,144,363 | 9/1992 | Wittekoek et al. | 355/53 |
| 5,191,374 | 3/1993 | Hazama et al. | 355/43 |
| 5,285,236 | 2/1994 | Jain | 355/53 |

FOREIGN PATENT DOCUMENTS

63-316430 12/1988 Japan.

*Primary Examiner*—Safet Metjahic
*Assistant Examiner*—Daniel P. Malley
*Attorney, Agent, or Firm*—Shapiro and Shapiro

[57] ABSTRACT

An apparatus has a pulse light source for emitting light pulses with varying light quantities, an illumination optical system for radiating the light pulses from the source onto a predetermined illumination region on a mask on which a transfer pattern is formed, and a projection optical system for projecting an image of the pattern onto a predetermined exposure region on a substrate, and which synchronously scans the mask and the substrate during the projection. The apparatus includes a measuring device for detecting intensities of the light pulses radiated onto the substrate during the scanning and measuring an integrated light quantity on each of a plurality of partial regions in the exposure region on the substrate on the basis of a detection signal of the intensities, wherein the partial regions are defined by a scanning speed of the photosensitive substrate and an oscillation interval of the light pulses. The apparatus further includes an adjusting device for adjusting an intensity of the next light pulse to be radiated onto the mask on the basis of a difference between a target integrated light quantity and the measured integrated light quantity on each of the partial regions when some light pulses are radiated onto the mask.

21 Claims, 6 Drawing Sheets

EXPOSURE CONTROL APPARATUS AND METHOD

This is a continuation of application Ser. No. 08/201,126 filed Feb. 24, 1994, now abandoned.

BACKGROUND OF THE INVENTION

1. Field of the Invention

The present invention relates to an exposure control apparatus and method for controlling the exposure value onto a photosensitive substrate and, more particularly, to exposure control of an exposure apparatus of a slit-scanning exposure type for exposing a pattern on a mask onto a photosensitive substrate by illuminating a rectangular or arcuated illumination region with light pulses from a pulse light source, and synchronously scanning the mask and the photosensitive substrate with respect to the illumination region.

2. Related Background Art

Conventionally, in the manufacture of a semiconductor element, a liquid-crystal display element, a thin-film magnetic head, or the like using a photolithography technique, a projection exposure apparatus for exposing a pattern on a photomask or a reticle (to be referred to as a "reticle" hereinafter) onto a photosensitive substrate such as a wafer or glass plate coated with, e.g., a photoresist via a projection optical system is used. Recently, the size of a single chip pattern (one shot area radiated onto a wafer) on a semiconductor element tends to become large, and the projection exposure apparatus is required to expose a pattern having a larger area on a reticle onto a photosensitive substrate (large area requirement). Also, it is required to increase the resolution of the projection optical system in correspondence with a decrease in line width of a pattern of, e.g., a semiconductor element.

However, it is not easy to increase the resolution of the projection optical system and to simultaneously increase the size of an exposure field of the projection optical system. In particular, when a catadioptric system is used as the projection optical system, an aplanatic exposure field often has an arcuated shape.

In order to meet the above-mentioned large area requirement of a pattern to be transferred and limitation on the exposure field of the projection optical system, a projection exposure apparatus of a slit-scanning exposure type has been developed. In this apparatus, by synchronously scanning a reticle and a photosensitive substrate with respect to, e.g., a rectangular, arcuated, or hexagonal illumination region (to be referred to as a "slit-shaped illumination region"), a pattern, having an area wider than the slit-shaped illumination region, on the reticle is exposed onto the photosensitive substrate. In general, in a projection exposure apparatus, since an appropriate exposure value for a photosensitive material on a photosensitive substrate is determined, the projection exposure apparatus of the slit-scanning exposure type comprises an exposure control apparatus for controlling the exposure value with respect to the photosensitive substrate to coincide with an appropriate exposure value within a predetermined allowable range.

As one technique for increasing the resolution of a pattern to be exposed onto a photosensitive substrate, a technique for decreasing the wavelength of exposure light is known. In association with this technique, of existing light sources, those which emit light having a short wavelength are pulse-oscillation type laser light sources (pulse-oscillation light sources) such as an excimer laser light source, a metal vapor laser light source, and the like. However, unlike a continuous emission type light source such as a mercury lamp, energy of light pulses emitted from a pulse-oscillation light source varies within a predetermined range in units of pulse emissions.

Therefore, in the conventional exposure control apparatus, when the average energy of light pulses emitted from the pulse-oscillation light source is represented by pa, and the range of a variation in pulse energy of the light pulses is represented by $\Delta p$, it is assumed that a parameter $\Delta p/pa$ representing the variation in pulse energy has a normal distribution (is random). When the number of light pulses radiated onto a certain region (to be referred to as a "pulse count integrating region" hereinafter) on a photosensitive substrate which is scanned relative to an exposure region conjugate with a slit-shaped illumination region illuminated with light pulses is represented by n, by utilizing the fact that a variation in integrated exposure value after the end of exposure is given by $(\Delta p/pa)/n^{1/2}$, the integrated exposure value is controlled to reach an appropriate exposure value within a predetermined allowable range under the assumption that the variation $(\Delta p/pa)$ in pulse energy does not exceed a predetermined value. For example, when $\Delta p/pa$ three times a standard deviation $\sigma$ is assumed to be 10%, in order to set a desired reproduction precision A of an integrated exposure value three times the standard deviation $\sigma$ to be 1%, n is 100 or more. Therefore, it suffices if the reticle and the photosensitive substrate are synchronously scanned relative to a slit-shaped illumination region, so that the number of light pulses radiated onto each pulse count integrating region on the photosensitive substrate becomes 100 or more.

However, since conventional exposure value control is open control, when the oscillation state of the pulse-oscillation light source fluctuates for some reason, and the variation $(\Delta p/pa)$ in pulse energy temporarily exceeds 10%, the desired reproduction precision A of the integrated exposure value can no longer be obtained.

In order to solve this problem, in a projection exposure apparatus such as a stepper for exposing a pattern on a reticle onto a photosensitive substrate while the reticle and the photosensitive substrate stand still, as disclosed in commonly assigned Japanese Laid-Open Patent Application No. 63-316430 and U.S. Pat. No. 4,970,546, a modified exposure method for performing exposure by reducing some last light pulses, and a cutoff method for ending exposure when the integrated exposure value reaches an appropriate exposure value within a target precision range are known. In the cutoff method, the number of light pulses radiated onto the photosensitive substrate is not constant. Furthermore, as filed in commonly assigned U.S. patent application Ser. No. 623,176 (May 12, 1990), a technique for controlling an exposure value by finely adjusting pulse energy in units of pulses is also known.

However, due to the unique feature of the projection exposure apparatus of the slit-scanning exposure type, that is, since light pulses radiated on a plurality of pulse count integrating regions on the photosensitive substrate have different integrated energy levels, the above-mentioned exposure value control method proposed for a non-scanning type exposure apparatus cannot be directly applied.

SUMMARY OF THE INVENTION

The present invention has been made in consideration of the above-mentioned problems, and has as its object to provide an exposure control apparatus for an exposure apparatus which synchronously scans a reticle (mask) R and a photosensitive substrate (W) relative to a slit-shaped illumination region by illuminating the slit-shaped illumination region with light pulses, wherein even when a variation in pulse energy in units of light pulses exceeds a predetermined range, an integrated exposure value onto the photosensitive substrate (W) can be controlled to be close to an appropriate exposure value.

A projection exposure apparatus of the present invention which comprises a pulse light source (1) for emitting light pulses whose quantities vary within a predetermined range for every oscillations, an illumination system (2, 5–10) for radiating the light pulses from the pulse light source (1) onto a predetermined illumination region on a mask (R) on which a transfer pattern is formed, and a projection optical system (PL) for projecting an image of the pattern on the mask (R) radiated with the light pulses into a predetermined exposure region on a photosensitive substrate (W), and a scanning system which synchronously scans the mask (R) and the photosensitive substrate (W) relative to the projection optical system upon projection of the image of the pattern, comprises:

(a) a measurement system (14–16) for detecting the intensity of the light pulses radiated onto the photosensitive substrate (W) during scanning of the mask (R) and the photosensitive substrate (W), and measuring an integrated light quantity of each of a plurality of partial regions in the exposure region on the photosensitive substrate (W) on the basis of the detection signal;

the plurality of partial regions being defined by the scanning speed of the photosensitive substrate (W) and the emission interval of the light pulses; and (b) an adjusting system (16, 19) for adjusting the intensity of the next light pulse to be radiated onto the mask (R) on the basis of a difference between a target integrated light quantity and a measured integrated light quantity of each of the plurality of partial regions upon radiation of some light pulses onto the mask (R).

Also, an exposure apparatus according to the present invention, which comprises a pulse light source (1) for emitting light pulses whose quantities vary within a predetermined range for every oscillations, radiates a plurality of light pulses emitted from the pulse light source (1) onto a first object (R), synchronously scans the first object (R) and a photosensitive second object (W), and exposes a pattern on the first object (R) onto the second object (W), comprises:

(a) an illumination optical system (2, 5–10) for radiating the light pulses from the pulse light source (1) onto a predetermined illumination region on the first object (R);

(b) a measurement system (14–16) for detecting the intensity of the light pulses radiated onto the second object (W) during scanning exposure, and measuring an integrated light quantity on each of a plurality of partial regions in the illumination region on the second object, which region is irradiated with the light pulses incident on the second object (W) via the first object (R), on the basis of the detection signal, the plurality of partial regions being defined by the scanning speed of the second object (W) and the emission interval of the light. pulses; and (c) an adjusting system (16, 19) for adjusting the intensity of the next light pulse to be radiated onto the first object (R) on the basis of a difference between the integrated light quantity and a target integrated light quantity of each of the plurality of partial regions upon radiation of some light pulses onto the first object (R).

As described above, according to the present invention, when a pattern on the mask (R) as the first object is exposed onto the photosensitive substrate (W) as the second object by the slit-scanning exposure method using light pulses from the pulse light source (1), a plurality of partial regions (A1, A2, A3, . . . ) on the photosensitive substrate (W) have different integrated exposure values of the radiated light pulses, as shown in, e.g., FIG. 5. Thus, the measurement system (16, 19) detects the intensity of light pulses radiated onto the photosensitive substrate (W), and measures the integrated exposure value so far of each of the partial regions (A1, A2, A3, . . . ) on the basis of the detection signal. The adjusting system (16, 19) calculates a difference between the integrated exposure value so far and a target integrated exposure value to be obtained upon radiation of the next light pulse for each partial region, and adjusts the intensity of light pulses radiated from the pulse light source (1) on the basis of the difference. In this manner, an average integrated light quantity on the entire exposure surface of the photosensitive substrate (W) can be controlled to coincide with an appropriate exposure value within a predetermined allowable range.

Furthermore, an exposure method according to the present invention in which a first object (R) is irradiated with light pulses whose quantities vary within a predetermined range for every oscillations, and the first object (R) and a photosensitive second object (W) are synchronously scanned, and a pattern on the first object (R) is exposed onto the second object (W), comprises the steps of:

detecting the intensity of the light pulses radiated onto the second object (W) during scanning exposure;

measuring an integrated light quantity on each of a plurality of partial regions which are defined on the second object (W) by the scanning speed of the second object (W) and the oscillation interval of the light pulses, and are present within an illumination region of the light pulses which are incident on the second object (W) via the first object (R), when some light pulses are radiated onto the first object (R); and adjusting the intensity of the next light pulse to be radiated onto the first object (R) on the basis of a difference between the measured integrated light quantity and a target integrated light quantity of each of the plurality of partial regions.

As described above, according to the present invention, the intensity of light pulses radiated onto the second object (W) during scanning exposure is detected, and an integrated exposure value on each of partial regions (A1, A2, A3, . . . ) is measured on the basis of the detection signal, as shown in, e.g., FIG. 5. A difference between the measured integrated light quantity and a target integrated exposure value to be obtained upon radiation of the next light pulse is calculated, and the light quantity of the light pulse radiated from the pulse light source (1) is adjusted based on the difference. Thus, an average integrated light quantity on the entire exposure surface of the second object (W) can be controlled to coincide with an appropriate exposure value within a predetermined allowable range.

DESCRIPTION OF THE PREFERRED EMBODIMENTS

An embodiment of an exposure control apparatus according to the present invention will now be described with reference to the accompanying drawings. In this embodiment, the present invention is applied to a projection exposure apparatus of a slit-scanning exposure type, which has a pulse-oscillation type exposure light source such as an excimer laser source as a light source.

Figure 1:
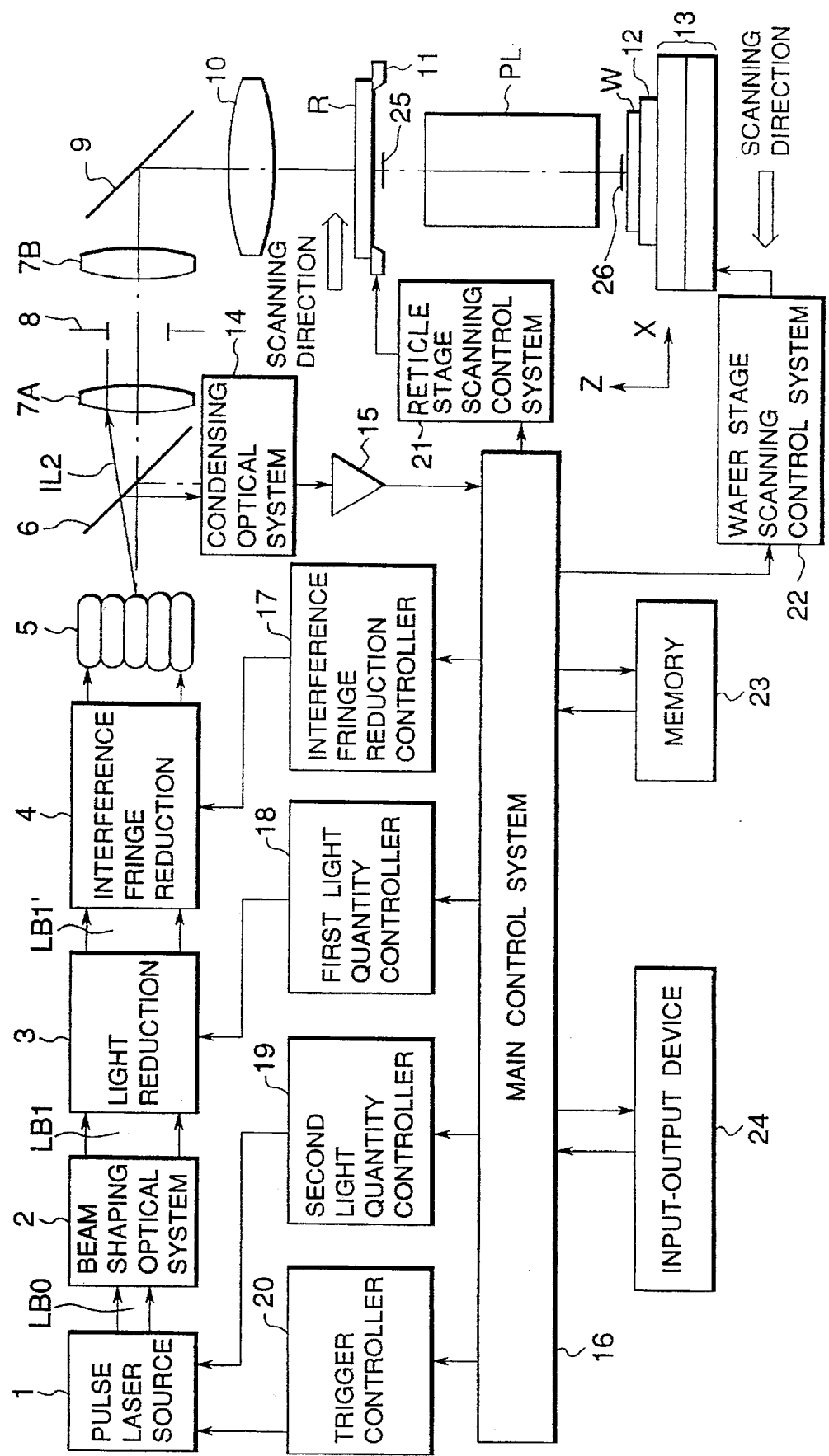
FIG. 1 is a block diagram showing a projection exposure apparatus to which an embodiment of an exposure control apparatus according to the present invention is applied.

FIG. 1 shows the projection exposure apparatus of this embodiment. Referring to FIG. 1, a pulse laser light source 1 such as an excimer laser source is connected to a trigger controller 20 for outputting external trigger pulses. The trigger controller 20 controls oscillation of the pulse laser source 1 in accordance with a command signal from a main control system 16 for controlling the operation of the overall apparatus. Light pulses emitted from the pulse laser source 1 of this embodiment are coherent.

The exposure control apparatus of this embodiment comprises a first light quantity controller 18 for coarse adjustment, and a second light quantity controller 19 for fine adjustment as light quantity control means. The second light quantity controller 19 controls the integrated charge quantity (applied voltage) for pulse emission of the pulse laser source 1. The second light quantity controller 19 controls the applied voltage to the pulse laser source 1 on the basis of a command signal from the main control system 16, thereby finely adjusting pulse energy (exposure energy) in units of light pulses emitted from the pulse laser source 1.

Figure 2:
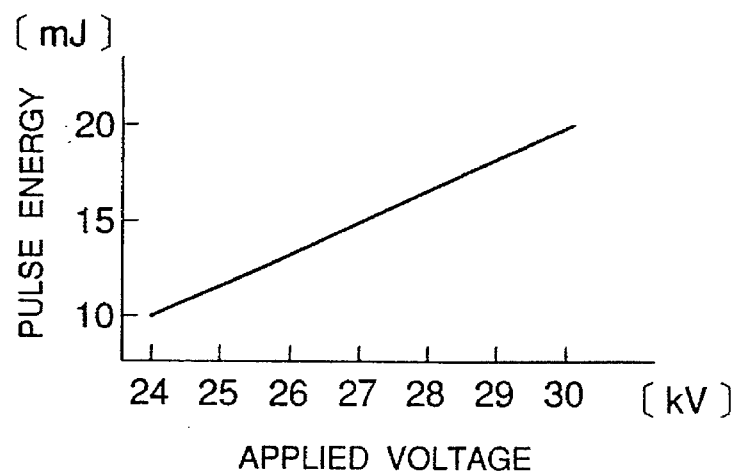
FIG. 2 is a graph showing the relationship between the applied voltage and pulse energy of a pulse laser light source 1 shown in FIG. 1.

FIG. 2 shows the relationship between the applied voltage and pulse energy. As shown in FIG. 2, by changing the applied voltage to the pulse laser source 1, the energy of light pulses emitted from the pulse laser source 1 can be changed to have almost a linear relationship with the applied voltage. In this embodiment, pulse energy is finely adjusted in units of light pulses by changing the applied voltage to the pulse laser source 1. Also, a method for finely adjusting pulse energy by changing a current to be supplied to the laser pulse source 1 is available.

Referring back to FIG. 1, the pulse laser source 1 is constituted as a laser source having a stable resonator, which has a narrow-band wavelength stabilizing mechanism constituted by an etalon, a dispersion element, or the like on a portion between two oscillation mirrors which are arranged at two ends to sandwich a laser tube therebetween. The pulse laser source 1 oscillates ultraviolet rays of a wavelength capable of exposing a photoresist layer on a wafer W, e.g., a KrF excimer laser beam (wavelength=248 nm) by causing a high-voltage discharge between two parallel electrodes extending along the optical axis of the laser beam. A laser beam LB0 emitted from the pulse laser source 1 has a rectangular sectional shape according to the arrangement pattern of these two electrodes, i.e., the beam section has a rectangular shape having an aspect ratio of about 1/2 to 1/5. The laser beam LB0 is incident on a beam shaping optical system 2 comprising a cylindrical lens, a beam expander, and the like, and the beam shaping optical system 2 outputs a laser beam LB1 which is shaped to have a square beam sectional shape, and to have a size which allows efficient incidence on a fly-eye lens 5 (to be described later).

The laser beam LB1 is incident on a light reduction unit 3. The light reduction unit 3 attenuates the incident laser beam at a desired ratio by continuously or discretely changing the transmittance for the incident laser beam within a range from 100% (complete transmission) to 0% (complete shielding). The transmittance of the light reduction unit 3 is determined by an appropriate exposure value and the number Next of pulses for a certain point on the wafer W required for actual exposure, which is, in turn, determined by the number $N_{sp}$ required for smoothing an interference pattern formed on a reticle R or a wafer W, and the number $N_e$ of pulses required for controlling an integrated exposure value at a certain point on the wafer W with a desired exposure value control precision. This will be described in detail later.

If the transmittance of the light reduction unit 3 is set to have, e.g., six discrete steps, the transmittance is selected before the beginning of exposure, and is not changed to another value at least during exposure onto a single exposure field on the reticle R. In other words, the light reduction unit 3 uniformly attenuates the quantities of all light pulses at a predetermined light reduction ratio as long as the exposure condition (an appropriate exposure value for a certain point on the wafer W) onto the wafer W remains the same. Therefore, the light reduction unit 3 may comprise a light quantity fine adjustment mechanism having a relatively low response speed (switching speed between different transmittances). The light reduction unit 3 of this embodiment adopts a mechanism which comprises six mesh filters attached to a revolver, and having different transmittances, and rotates the revolver.

Figure 3:
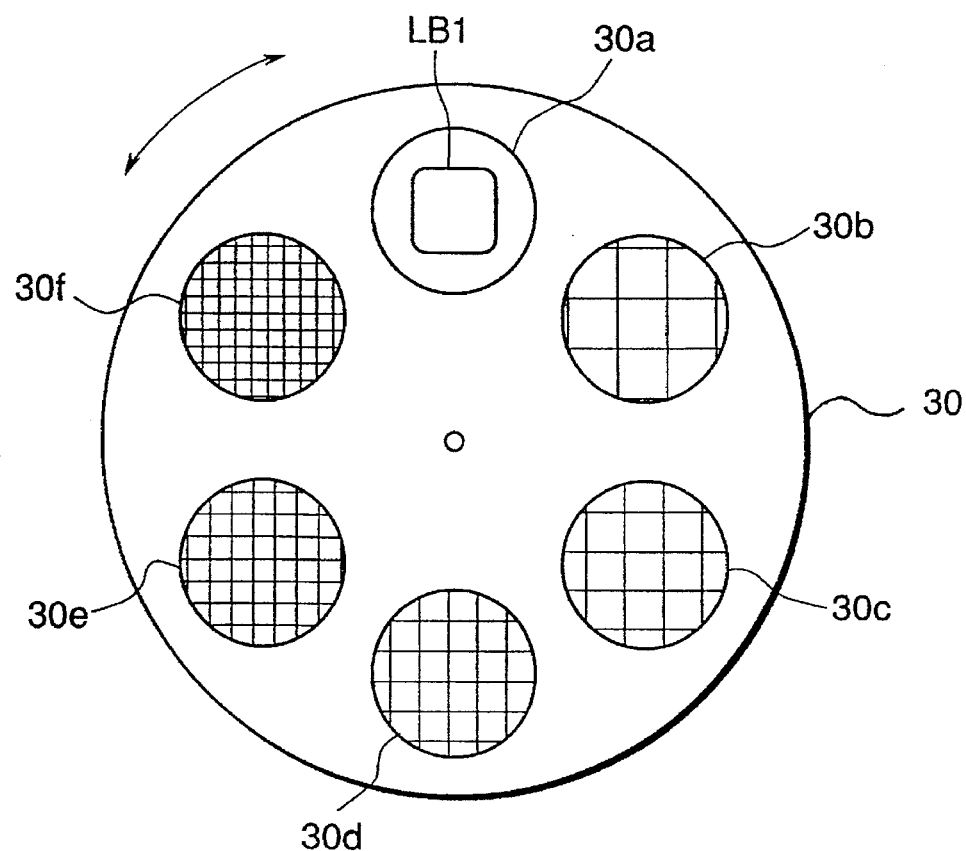
FIG. 3 is a front view showing the arrangement of a light reduction unit 3 shown in FIG. 1.

FIG. 3 shows the revolver type light reduction unit 3. Referring to FIG. 3, six different mesh filters 30a to 30f are attached to a disk-shaped revolver plate 30 at angular intervals of about 60° to have the rotational axis as the center. One of the mesh filters 30a to 30f is set in the optical path of the laser beam LB1 shown in FIG. 1. In FIG. 3, the transmittance of the mesh filter 30a is about 100%, and the transmittances of the remaining mesh filters 30b to 30f are set to gradually decrease.

As light reduction elements to be attached to the revolver plate 30, dielectric mirrors having different transmittances may be used in place of the mesh filters. Also, when two sets of revolver plates 30 are arranged at a predetermined interval to be rotated relative to each other, the transmittances of the first revolver plate are set to be, e.g., 100%, 90%, 80%, 70%, 60%, and 50%, and those of the second revolver plate are set to be, e.g., 100%, 40%, 30%, 20%, 10%, and 5%, a total of 36 different transmittances can be realized by combining these two plates.

As a light reduction method of the light reduction unit 3, various methods can be used. For example, a diaphragm having a predetermined rectangular aperture can be combined with a zoom lens system, and light reduction can be continuously performed by changing the combination of the variable zoom ratio and the variable width of the rectangular aperture. Furthermore, a method of rotating a so-called etalon obtained by holding two glass plates (quartz plates or the like) to be substantially parallel to each other, or a method of moving two phase gratings or amplitude gratings relative to each other may be used. Alternatively, when a linearly polarized laser beam is used as exposure light, a method of rotating a polarization plate may be adopted as the light reduction method of the light reduction unit 3.

Referring back to FIG. 1, a substantially collimated laser beam LB1' which is attenuated by the light reduction unit 3 at a predetermined light reduction ratio is incident on the fly-eye lens (optical integrator) 5 via an interference fringe reduction unit 4 for averaging an interference pattern. The interference fringe reduction unit 4 has a vibration mirror which is one-dimensionally (or two-dimensionally) vibrated by an actuator (e.g., a piezo element), and one-dimensionally (or two-dimensionally) moves an interference pattern on the reticle R (or the wafer W) by changing the incident angle of the laser beam LB1' incident on the fly-eye lens 5 in units of light pulses, thereby finally smoothing the interference pattern. In other words, the interference fringe reduction unit 4 is used for increasing the uniformity of the illuminance of a pulse laser beam on the reticle R (or the wafer W), and the details of its principle are disclosed in U.S. Pat. No. 4,619,508.

The interference fringe reduction unit 4 may comprise an arrangement for rotating, e.g., a diffusion plate in synchronism with emission of light pulses in place of the arrangement using the vibration mirror.

A laser beam IL2 emerging from the fly-eye lens 5 is incident on a beam splitter 6 having a high transmittance and a low reflectance. The laser beam IL2 transmitted through the beam splitter 6 is incident on a field stop 8 via a first relay lens 7A. The sectional shape of the laser beam IL2 is shaped into a slit shape by the field stop 8. The arrangement plane of the field stop 8 is located at a position conjugate with the pattern formation surface of the reticle R and the exposure surface of the wafer W, and by adjusting the shape of the aperture portion of the field stop 8, an illumination field having a desired shape can be obtained on the reticle R. The laser beam IL2 emerging from the aperture portion of the field stop 8 illuminates a portion of a pattern region on the reticle R with a slit-shaped illumination region 25 via a second relay lens 7B, a bending mirror 9, and a main condenser lens 10. The reticle R is placed on a reticle stage 11.

A laser beam diffracted by the pattern region on the reticle R forms a pattern image on the reticle R onto a photoresist layer as a photosensitive material on the wafer W via a projection optical system PL. More specifically, an image of a circuit pattern in the slit-shaped illumination region 25 is projected onto the exposure surface of the wafer W in a slit-shaped exposure region 26 conjugate with the slit-shaped illumination region 25 on the reticle R. The wafer W is vacuum-chucked on a wafer holder 12 on a wafer stage 13, and the wafer stage 13 is constituted by an X stage for scanning the wafer W in the X direction as one direction in a plane perpendicular to the optical axis of the projection optical system PL, a Y stage for aligning the wafer W in the Y direction perpendicular to the X direction in the plane perpendicular to the optical axis, a Z stage for aligning the wafer W in the Z direction parallel to the direction of the optical axis, and the like.

Upon execution of exposure based on a slit-scanning exposure method, a reticle stage scanning control system 21 and a wafer stage scanning control system 22 respectively drive the reticle stage 11 and the wafer stage 13 on the basis of commands from the main control system (controller) 16.

The wafer W is scanned in the −X direction with respect to the slit-shaped exposure region 26 in synchronism with scanning of the reticle R in the X direction with respect to the slit-shaped illumination region 25. The relationship among an appropriate exposure value, the scanning speed in synchronous scanning, the laser oscillation frequency, and the like will be described in detail later.

Of the laser beam IL2 emerging from the fly-eye lens 5, a laser beam reflected by the beam splitter 6 is focused on the light-receiving surface of a light-receiving element (photoelectric detector) 15 by a condensing optical system 14. The light-receiving element 15 precisely outputs a photoelectric signal according to the light quantity (light intensity) of each light pulse of the laser beam, and comprises a PIN photodiode having a sufficient sensitivity in an ultraviolet region, and the like. A photoelectric signal output from the light-receiving element 15 is supplied to the main control system 16, and the main control system 16 include a calculator which sequentially integrates the light quantities of light pulses.

The measured value (integrated light quantity) serves as fundamental data upon control of the applied voltage in units of light pulses for the pulse laser source 1 and upon execution of oscillation, control in units of light pulses of the pulse laser source 1 via the trigger controller 20 in the main control system 16. Note that the relationship between the illuminance of the laser beam on the exposure surface of the wafer W and the photoelectric signal output from the light-receiving element 15 is obtained by, e.g., a power meter in advance, and is stored in a memory 23.

The main control system 16 is connected to an input-output device 24 and the memory 23. On the basis of the measured value from the light-receiving element 15, the main control system 16 outputs a control command to the trigger controller 20 and also outputs predetermined command signals to the first and second light quantity controllers 18 and 19, and an interference fringe reduction controller 17. The main control system 16 systematically controls the operation 10 of the entire projection exposure apparatus. The input-output device 24 serves as a man-machine interface between an operator and the projection apparatus main body, transmits various parameters necessary for exposure from the operator to the main control system 16, and informs the operation state of the main control system 16 to the operator.

The memory 23 stores parameters (constants) and tables input from the input-output device 24 and required for an exposure operation, various calculations, and the like; photosensitive characteristics of the light-receiving element 15; and the like. In particular, in this embodiment, the memory 23 stores information of a minimum number $N_{sp}$ of pulses required for satisfactorily smoothing an interference pattern by the interference fringe reduction unit 4, and the number $N_e$ of pulses required for controlling an integrated exposure value with a desired exposure value control precision.

A method of determining a transmittance $\alpha$ of the reduction unit 3 and a synchronous scanning speed v (cm/sec) of the wafer stage 13 by the main control system 16 will be described below. If the photoresist sensitivity on the wafer W is represented by S ($mj/cm^2$), the energy density per light pulse on the exposure surface of the wafer W in a non-light reduction state is represented by p ($mj/cm^2$·pulse), the transmittance of the first light quantity controller 18 is represented by $\alpha$, the transmittance of the second light quantity controller 19 is represented by $\beta$, the slit width, in the scanning direction, of the slit-shaped exposure region 26 on the exposure surface of the wafer W is represented by D (cm), and the laser oscillation frequency of the pulse laser source 1 is represented by f (Hz), the number $N_{exp}$ of pulses required for exposing a certain point on the exposure surface of the wafer W is given by:

$$N_{exp} = S/(\alpha \cdot \beta p) = d \cdot f/v = \text{integer} \quad (1)$$

From formula (1), $S/(\alpha \cdot \beta \cdot p)$ must be converted into an integer, and conversely, when $S/(\alpha \cdot \beta p)$ cannot be converted into an integer even after the transmittance $\beta$ is finely adjusted, an offset (error) from a target value undesirably results upon exposure. Therefore, the transmittance $\beta$ must be largely changed by a method of uniformly controlling all light pulses in place of a method of controlling each light pulse by the second light quantity controller 19. Similarly, $D \cdot f/v$ in formula (1) must be converted into an integer. When the slit width D in the scanning direction is constant, and the laser oscillation frequency f assumes a maximum value (such a case is advantageous in terms of the throughput), the scanning speed v must be adjusted.

When the photoresist has a low sensitivity, i.e., the sensitivity S has a large value, it is preferable that the scanning speed v be decreased. When the photoresist has a high sensitivity, i.e., the sensitivity S has a small value, the scanning speed v must be increased. However, the scanning speed v has an allowable maximum value $v_{max}$. For this reason, when the scanning speed v exceeds its maximum value, the transmittance $\alpha$ must be decreased by controlling the light reduction unit 3 by the first light quantity controller 18, so that the scanning speed v becomes smaller than the maximum value $v_{max}$. The number $N_{exp}$ of pulses must be larger than the minimum number $N_{sp}$ of pulses required for smoothing an interference pattern, and the number $N_e$ of pulses required for controlling an integrated exposure value with a desired exposure value control precision. To summarize the above-mentioned conditions, we have:

$$v_{max} \geq (D \cdot f/s) \cdot \alpha \cdot \beta p \quad (2)$$

$$N_{exp} = S/(\alpha \cdot \beta \cdot p) \geq \text{Max}(N_e, N_{sp}) \quad (3)$$

where the function Max(A, B) indicates a larger one of values A and B. From formulas (1) and (3), the following formulas are established:

$$\alpha \leq \text{Min} \frac{v_{max}}{Df} \cdot \frac{S}{\beta p}, \frac{1}{\text{Max}(N_e, N_{sp})} \cdot \frac{S}{\beta p} \quad (4)$$

where the function Min(A, B) indicates a smaller one of values A and B. When the transmittance $\alpha$ must be set, the transmittance $\beta$ is re-set based on formula (1) after the transmittance $\alpha$ is set. Thereafter, the scanning speed v is determined based on formula (1).

Energy fine adjustment executed when energy is adjusted via the second light quantity controller 19 in units of light pulses emitted from the pulse laser source 1 will be described below.

From formula (1), a distance $X_{step}$ by which the wafer stage 13 is scanned in the $-X$ direction as the scanning direction during each pulse emission interval of the pulse laser source 1 is given by:

$$X_{step} = D \cdot N_{exp} \quad (5)$$

In order to rewrite this formula, if the exposure surface of the wafer W is divided into regions each having the width $X_{step}$ in the scanning direction (to be referred to as "pulse count integrating regions" hereinafter), the width D, in the scanning direction, of the slit-shaped exposure region 26 on the wafer W is defined by multiplying $N_{exp}$ equal to the number of exposure pulses with the width $X_{step}$, in the scanning direction, of each of the pulse count integrating regions.

The integrated exposure value (light quantity) on each of a plurality of pulse count integrating regions on the wafer W will be described below with reference to FIGS. 4 and 5.

Figure 4:
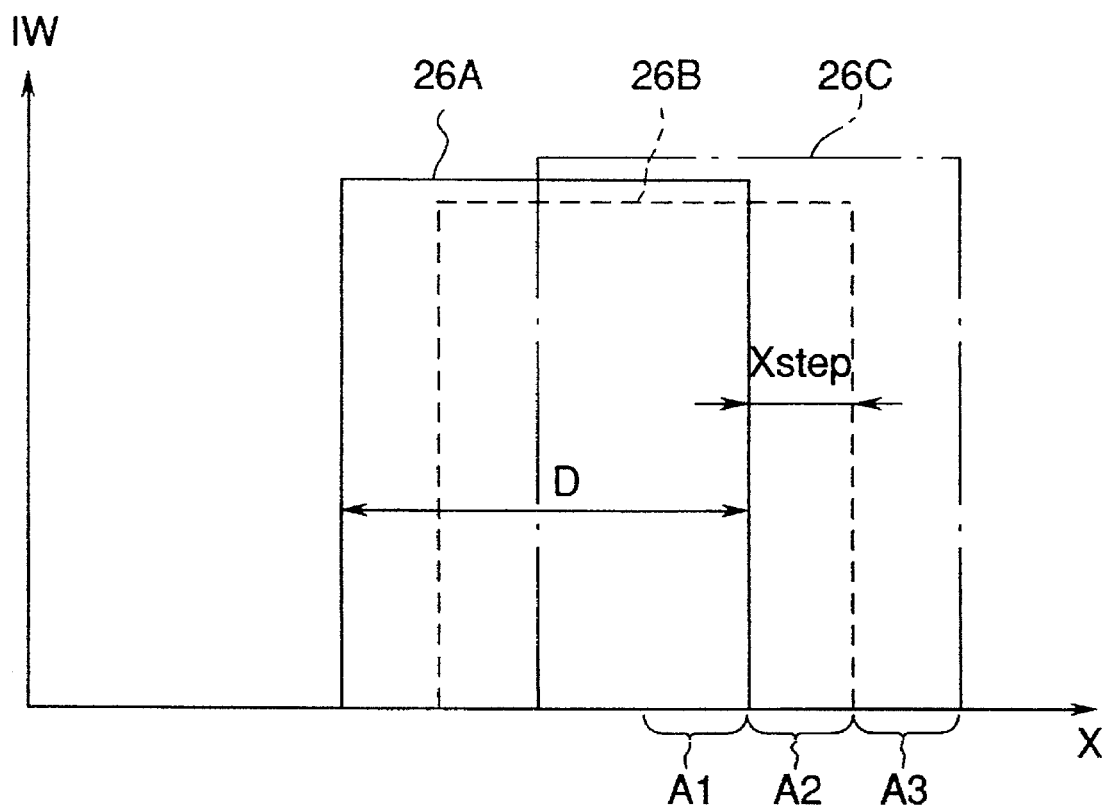
FIG. 4 is a graph showing the illuminance distribution of light pulses on a wafer of the embodiment in FIG. 1.
Figure 5:
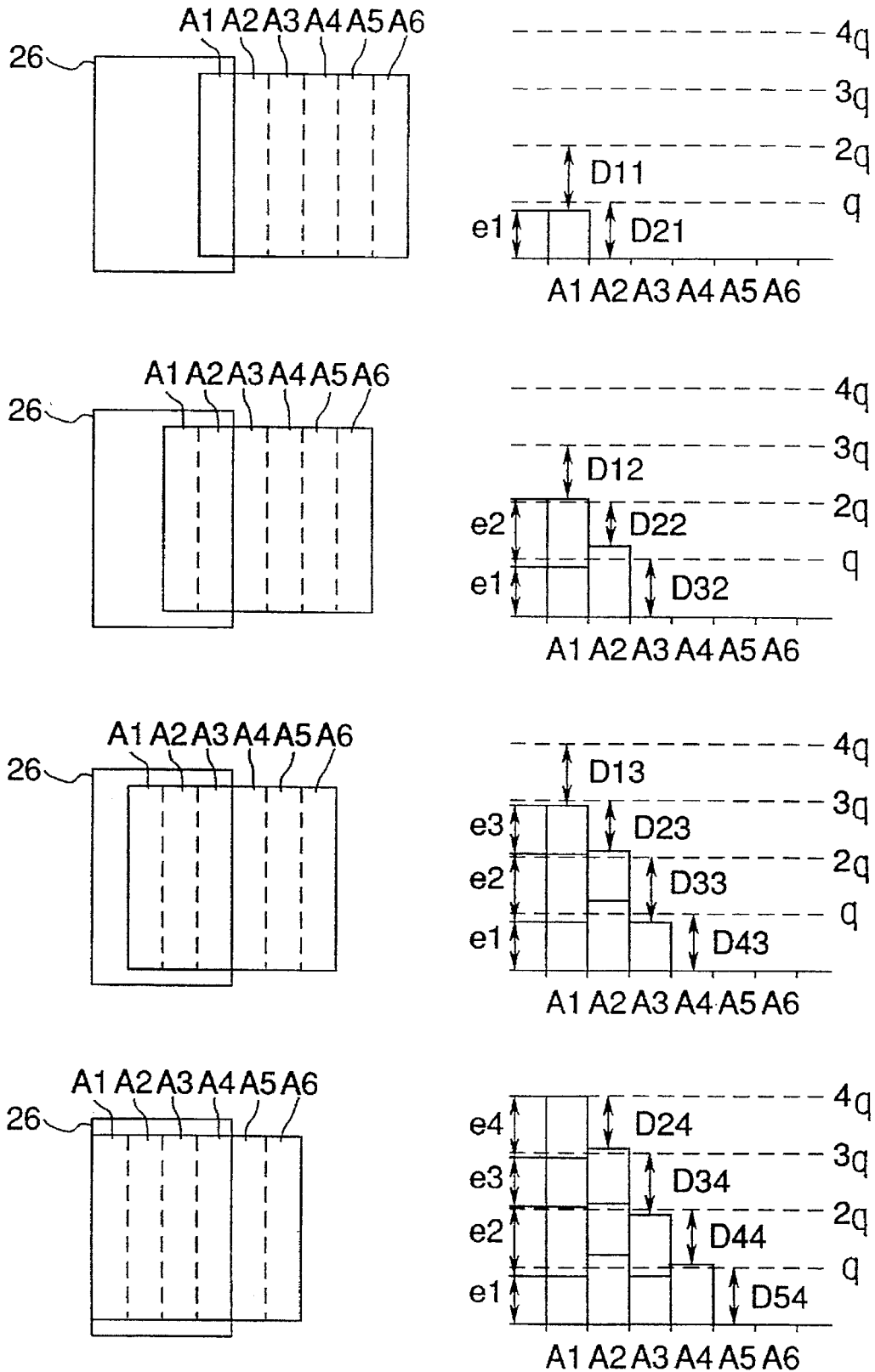
FIG. 5 is a view showing a change in integrated exposure value on respective pulse count integrating regions.

FIG. 4 shows a state wherein the exposure surface of the wafer W is divided into the pulse count integrating regions. In FIG. 4, the X coordinate at a certain timing on the wafer W is plotted along the abscissa, and an illuminance IW at each X position is plotted along the ordinate. FIG. 4 shows a case wherein the width D of the slit-shaped exposure region is four times the width $X_{step}$, in the scanning direction, of the pulse count integrating region, i.e., the number $N_{exp}$ of exposure pulses is four (in practice, several 10 pulses or more are required). In FIG. 4, the slit-shaped exposure region scans the wafer W in the X direction for the sake of simplicity. When the illuminance distribution by the first light pulse is represented by a rectangular illuminance distribution 26A, an illuminance distribution 26B by the second light pulse is shifted by $X_{step}$ in the X direction from the illuminance distribution 26A by scanning of the wafer W relative to the slit-shaped exposure region. Similarly, an illuminance distribution 26C by the third light pulse is shifted by $X_{step}$ from the illuminance distribution 26B in the X direction. Then, the illuminance distributions by the light pulses are successively shifted by $X_{step}$ in the X direction. The value of the illuminance distribution IW by energy of each light pulse varies due to a variation in output from the pulse laser source 1.

For this reason, a pulse count integrating region A1 of the width $X_{step}$ irradiated with the first light pulse, a pulse count integrating region A2 of the width $X_{step}$ irradiated with the second light pulse, and a pulse count integrating region A3 of the width $X_{step}$ irradiated with the third light pulse have different integrated exposure values, respectively.

A method of calculating energy of the next pulse laser beam to be radiated from the pulse laser source 1 in the main control system 16 will be described below with reference to FIG. 5. FIG. 5 shows a change in integrated exposure value over time on each pulse count integrating region. Also, FIG. 5 shows a state wherein the wafer W is scanned in the $-X$ direction relative to the slit-shaped exposure region, and the pulse laser source 1 emits a light pulse.. Assume that the transmittance $\alpha$ is determined in advance by formula (4), and the transmittance $\beta$ is finely adjusted to convert ($N_{exp} = S/(\alpha \cdot \beta \cdot p)$) in formula (1) into an integer. The pulse energy density on the exposure surface of the wafer W is represented by q (mJ/cm$^2$·pulse) (=$\alpha \cdot \beta \cdot pa$). A variable pa is an average value of the energy density p per pulse on the exposure surface of the wafer W in a non-light reduction state.

When the first pulse light is emitted to the wafer W, the main control system 16 adjusts the applied voltage of the pulse laser source 1 via the second light quantity controller 19 by the above-mentioned calculation, so that the light pulse has energy q. In this case, assuming that the exposure value of the first pulse actually detected by the light-receiving element 15 is e1, as shown in FIG. 5, the main control system 16 calculates a difference D11 between the integrated exposure value e1 by the first pulse and a target integrated exposure value (target exposure dose) 2q by the second pulse on the pulse count integrating region A1. Furthermore, the main control system 16 calculates a difference D21 (=q) between an integrated exposure value 0 by the first pulse and the target integrated exposure value q on the pulse count integrating region A2. Then, the control system 16 calculates an average value (D11+D21)/2 of the calculated differences. The main control system 16 finely adjusts the applied voltage of the pulse laser source via the second light quantity controller 19, so that the light quantity of the second pulse emitted from the pulse laser source 1 becomes equal to the average value (D11+D21)/2 of the differences. Thereafter, the second pulse is emitted. If the actually detected exposure value of the second pulse is e2, the main control system 16 calculates a difference D12 between the integrated exposure value (e1+e2) and a target integrated exposure value $3q$ by the third pulse on the pulse count integrating region A1. Similarly, the control system 16 calculates a difference D22 between the integrated exposure value and a target integrated exposure value $2q$ by the third pulse on the pulse count integrating region A2, and a difference D32 between the integrated exposure value and the target integrated exposure value $q$ by the third pulse on the pulse count integrating region A3, and then calculates an average value (D12+D22+D32)/3 of these differences. The main control system 16 finely adjusts the applied voltage of the pulse laser source 1 via the second light quantity controller 19, so that the light quantity of the third pulse becomes equal to (D12+D22+D32)/3, and thereafter, the third pulse is emitted. Similarly, upon completion of emission of the third pulse, the main control system 16 calculates differences D13, D23, D33, and D43 between the integrated exposure values by the third pulse and the target integrated exposure values by the fourth pulse on the pulse count integrating regions A1, A2, A3, and A4, and adjusts the light quantity of the light pulse on the basis of an average value of these differences. At the fifth pulse as well, the main control system 16 calculates differences D24, D34, D44, and D54 between integrated exposure values by the fourth pulse and the target integrated exposure values by the fifth pulse on the pulse count integrating regions A2, A3, A4, and A5, and adjusts the light quantity of the light pulse on the basis of an average value of these differences. If the first pulse with which the exposure surface of the wafer W is actually exposed by scanning exposure is represented by n=1, a target light quantity $Q_n$ of an n-th pulse can be obtained by the following formulas:

$$Q_1 = q \qquad (6)$$

$$Q_n = \frac{1}{n} \left\{ q + \sum_{i=2}^{n} i \cdot q - \sum_{j=n-i+1}^{n-1} Tj \right\}$$

$$(2 \leq n < N_{exp})$$

$$Q_n = \frac{1}{N_{exp}} \left\{ q + \sum_{i=2}^{N_{exp}} i \cdot q - \sum_{j=n-i+1}^{n-1} Tj \right\}$$

$$(N_{exp} \leq n < Me + 1)$$

$$Q_n = \frac{1}{n - \text{Int}(Me+1)} \left\{ q + \sum_{i=N_{exp}-n+\text{Int}(Me+1)+1}^{N_{exp}} i \cdot q - \sum_{j=n-i+1}^{n-1} Tj \right\}$$

where $Me = L/X_{step}$, and L is the length, in the scanning direction, of an exposure field on the wafer W. The term i·q in each of the second, third, and fourth formulas in formulas (6) represents the target integrated exposure value on the i-th pulse count integrating region, and the term ΣTj therein represents the integrated exposure value of light pulses exposed so far on the i-th pulse count integrating region. Therefore, each of the second, third, and fourth formulas in formula (6) means that the average value of differences between integrated exposure values so far on all pulse count integrating regions having the number of exposure pulses>$N_{exp}$, and the target integrated exposure values by the next pulse is defined as energy of the next pulse emission of the pulse laser source 1. More specifically, the main control system 16 in FIG. 1 adjusts the applied voltage of the pulse laser source 1 via the second light quantity controller 19, so that the average value of pulse energy to be radiated by the next light pulse on the pulse count integrating regions (A1, A2, A3, . . . in FIG. 4) is used as pulse energy of the next pulse emission of the pulse laser source 1.

Figure 6:
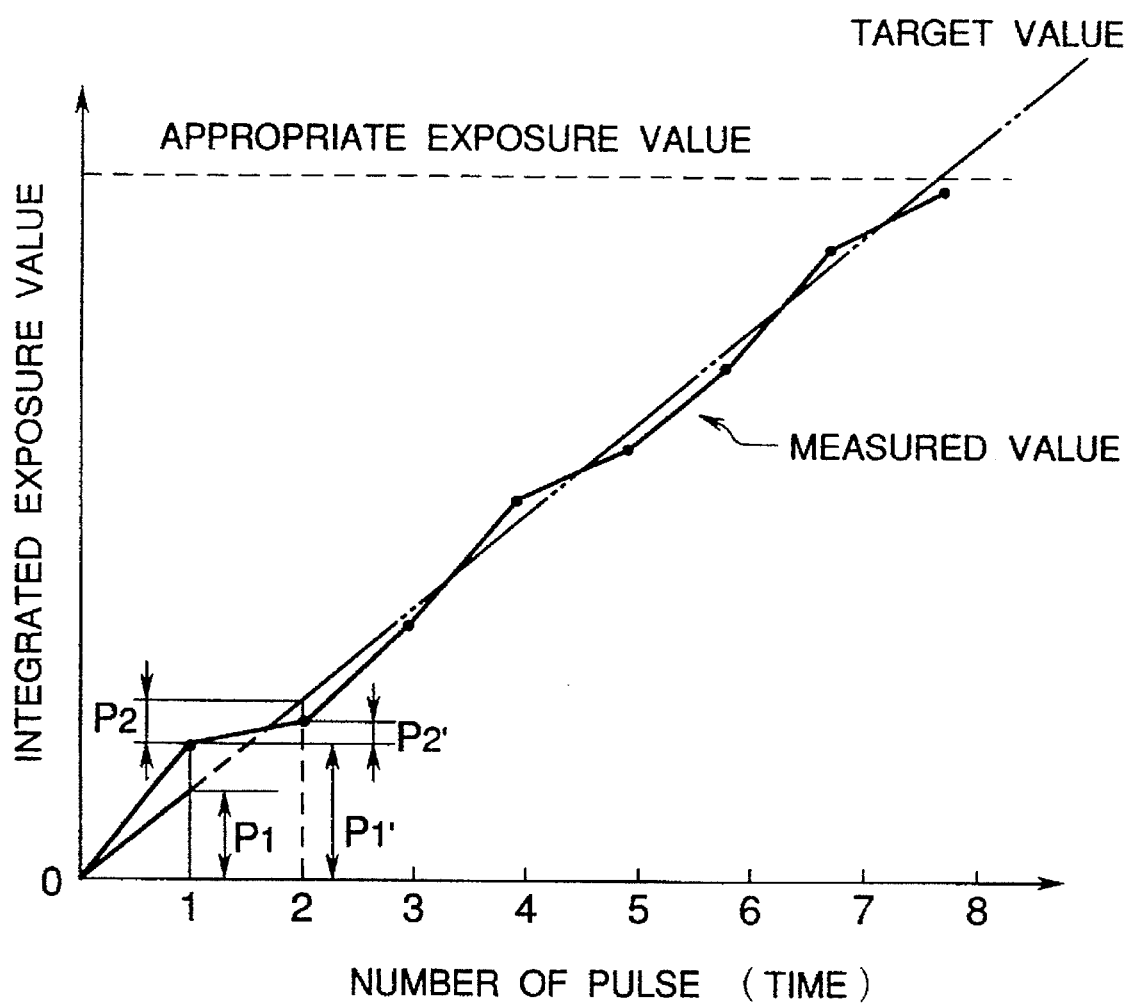
FIG. 6 is a graph showing a change in integrated exposure value on the first pulse count integrating region on the wafer of the embodiment in FIG. 1.

The control state of the integrated exposure value on the pulse count integrating region A1 in FIG. 5 will be described below with reference to FIG. 6. FIG. 6 shows a change in integrated exposure value in units of pulse emissions on the pulse count integrating region A1. In FIG. 6, a solid polygonal line represents the actually integrated exposure value, and an alternate long and two short dashed line represents the target integrated exposure value at the timing of radiation of each light pulse. FIG. 6 shows a case wherein the number $N_{exp}$ of exposure pulses is 8, i.e., the width D, in the scanning direction, of the slit-shaped exposure region 26 is $8 \cdot X_{step}$ for the sake of simplicity. If the actual exposure value for a target integrated exposure value $P_1$ of the first pulse is represented by $P_1$, an exposure value $P_2$ as a difference between a target integrated exposure value ($=2 \cdot P_1$) of the second pulse and the actual exposure value $P_1'$ is energy to be radiated by the second pulse on the pulse count integrating region A1.

In this embodiment, in place of directly using the exposure value $P_2$, differences between the target integrated exposure values by the second pulse and the integrated exposure values so far are calculated for the pulse count integrating regions to be exposed by the next pulse emission, and an average value of these differences is defined as energy to be radiated by the second pulse. The applied voltage of the pulse laser source 1 in FIG. 1 is controlled to obtain this energy. As a result, on the pulse count integrating region A1, energy of, e.g., an exposure value $P_2'$ is radiated upon radiation of the second light pulse. As for the third pulse and subsequent pulses, differences between target integrated exposure values and actual integrated exposure values are calculated for the pulse count integrating region A1 and other pulse count integrating regions, and an average value of these differences is defined as an exposure value of the next light pulse. The details of a method of calculating a target value of exposure energy by next pulse emission on each pulse count integrating region are filed as, e.g., U.S. Ser. No. 623,176 (Dec. 12, 1990).

When exposure is performed in this manner, the main control system 16 in FIG. 1 calculates the target value of pulse energy by the next light pulse in units of light pulses using formulas (6), and executes light quantity control of the pulse laser source 1 via the second light quantity controller 19 to obtain the calculated pulse energy. The exposure value control precision A of the method of this embodiment is given by:

$$A = \frac{1}{N_{exp}} \cdot \qquad (7)$$

$$\frac{(\Delta p/pa)}{1 - (\Delta p/pa)} \left\{ 1 - (\Delta p/pa) + \frac{1}{2} + \frac{1}{3} + \ldots + \frac{1}{N_{exp}} \right\}$$

where ($\Delta p/pa$) is the variation in pulse energy.

In order to obtain an exposure value control precision A=1% at ($\Delta p/pa$)=10%, $N_{exp} \geq 50$ pulses need only be satisfied from formula (7). In other words, $N_e \approx 50$. The number $N_{sp}$ of pulses in formula (3) required for reducing an interference fringe is normally experimentally determined, and 50 pulses are reckoned to suffice. Therefore, $\text{Max}(N_e, N_{sp})=50$ need only be set in formula (3).

In this embodiment, light quantity adjustment of light pulses is performed for each pulse. Alternatively, if a target light quantity Qn of the n-th pulse calculated in formulas (6) above falls within a light quantity range (adjustable range) of a light pulse which can be adjusted by the second light quantity controller 19, light quantity adjustment can be performed in units of an arbitrary number of pulses (e.g., in units of five pulses). The second light quantity controller 19 may be controlled to change the light quantity adjustment interval during single scanning exposure (e.g., adjustment in units of five pulses may be changed to adjustment in units of three pulses during exposure). Furthermore, only when the target light quantity Qn of the n-th pulse exceeds a predetermined allowable range in the above-mentioned adjustable range, the second light quantity controller 19 may be controlled to perform light quantity adjustment.

In this embodiment, upon radiation of the n-th light pulse, a difference between the integrated exposure value at that time and the target integrated exposure value to be given upon radiation of the (n+1)-th pulse is calculated. Alternatively, a difference (error) between the integrated exposure value and the target integrated exposure value upon radiation of the n-th light pulse may be calculated. Thus, an average value of errors obtained by the respective pulse count integrating regions is used as an offset in light quantity adjustment of the (n+1)-th light pulse, thereby adjusting the light quantity of the light pulse via the second light quantity controller 19.

Furthermore, in this embodiment, an average value of differences between the integrated exposure values and the target integrated exposure values on a plurality of pulse count integrating regions is calculated, and the average value is set to be a light quantity of the next light pulse. However, the present invention is not limited to this. For example, maximum and minimum values of these differences may be used, and an average value of the maximum and minimum values may be set to be a light quantity of the next light pulse.

Finally, in the case of the slit-scanning exposure type exposure apparatus, since pulses radiated in units of pulse count integrating regions in an exposure field are slightly shifted from each other, the above-mentioned exposure value control precision A varies in units of pulse count integrating regions. For example, assuming that $N_{exp}$ pulses from the n-th pulse to the $(n+N_{exp}-1)$-th pulse are radiated on a certain pulse count integrating region, $N_{exp}$ pulses from the (n+1)-th pulse to the $(n+N_{exp})$-th pulse are radiated on a neighboring pulse count integrating region on the trailing side in the scanning direction. For this reason, the main control system 16 discriminates the exposure value control precision in units of pulse count integrating regions. In this case, an internal memory for the integrated light quantity in the main control system 16 must have at least a capacity corresponding to $N_{exp}$ pulses, and ideally, it is desirable to prepare a capacity corresponding to $L/X_{step}$.

Figure 7:
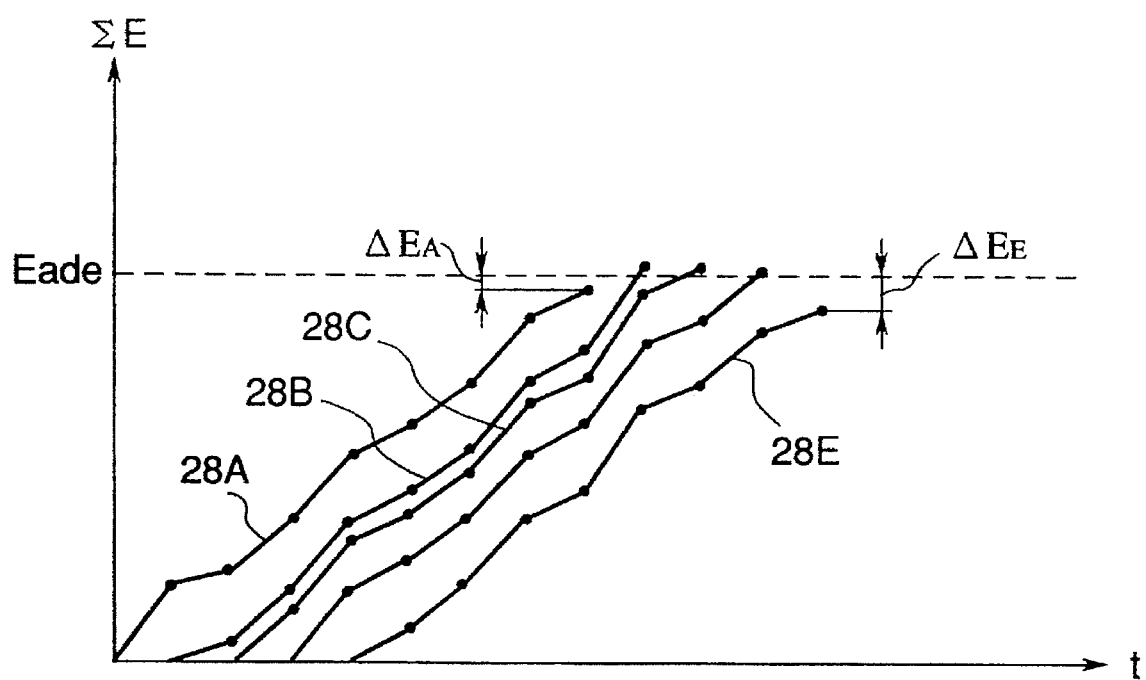
FIG. 7 is a graph showing changes in integrated exposure value on a plurality of pulse count integrating regions on the wafer of the embodiment in FIG. 1.

A method of discriminating whether or not exposure with an appropriate exposure value is performed on a wafer in a case wherein exposure is performed in units of pulse count integrating regions, as indicated by polygonal lines in FIG. 6, will be explained below with reference to FIG. 7. In FIG. 7, a polygonal line 28A represents a change in exposure value in the pulse count integrating region A1 shown in FIG. 6, and other polygonal lines 28B to 28E respectively represent changes in exposure values in the pulse count integrating regions A2 to A8 (not shown). In this case, in the first pulse count integrating region A1, a difference $\Delta E_A$ between an appropriate exposure value $E_{ade}$ and an actually integrated exposure value is calculated upon completion of exposure of the last pulse. When the difference $\Delta E_A$ exceeds a predetermined allowable value, the main control system 16 determines that the exposure value onto the wafer is not appropriate, and terminates the exposure process onto the wafer in an abnormal exposure state.

When the difference $\Delta E_A$ is equal to or smaller than the predetermined allowable value, a difference between the appropriate exposure value $E_{ade}$ and the actually integrated exposure value for each of the pulse count integrating regions A2, A3, . . . is calculated, and it is checked if differences $\Delta E_B$, $\Delta E_C$, . . . exceed the predetermined allowable value. Then, as indicated by the polygonal line 28E in FIG. 7, when a difference $\Delta E_E$ between the appropriate exposure value $E_{ade}$ and the actually integrated exposure value on the pulse count integrating region A8 (not shown) exceeds the predetermined allowable value, the exposure process onto the wafer is terminated in an abnormal exposure state. When the difference $\Delta E_E$ is equal to or smaller than the predetermined allowable value, a difference between the appropriate exposure value $E_{ade}$ and the actually integrated exposure value on the next pulse count integrating region is similarly calculated, and it is checked if the calculated difference exceeds the predetermined allowable value. Thus, it can be quickly and precisely discriminated whether or not the exposure value onto the wafer is appropriate.

The above-mentioned discrimination may be made not only when $N_{exp}$ pulses are radiated onto each pulse count integrating region but also when an arbitrary number of light pulses are radiated. More specifically, when the n-th light pulse is radiated onto an exposure field, the main control system 16 calculates differences between the integrated exposure values and the target integrated exposure values at that time in units of pulse count integrating regions, and if the system 16 detects any difference which exceeds the predetermined allowable value, it may terminate the exposure process onto the wafer at that time.

In this embodiment, as a method of adjusting the energy of each light pulse during single scanning exposure, a method of controlling the applied voltage to the pulse laser source 1 is used. Various other methods may be used as long as they can obtain a transmittance which changes continuously, and have a high response speed. More specifically, a combination of an aperture and a zoom lens system, an etalon, two phase gratings or density gratings, a rotary polarization plate (in the case of a linearly polarized light laser), or the like, which have been described above as examples of the light reduction unit 3, may be used.

As described above, the present invention is not limited to the above-mentioned embodiment, and various changes and modifications may be made within the spirit and scope of the invention.

What is claimed is:

1. A scanning exposure apparatus comprising:
   an illumination system for illuminating a mask with light pulses;
   a projection optical system receiving light pulses from said mask and having an image field which is smaller than an exposure region on a photosensitive substrate, in which region an image of a pattern on said mask is to be formed by light pulses radiated from said projection optical system;

a scanning system which synchronously scans said mask and said substrate relative to said projection optical system for scanning exposure;

a measurement system which measures, during the scanning exposure, individual integrated light quantities radiated on each of a plurality of partial regions, respectively in said exposure region, within the image field to be irradiated with a next light pulse, based on intensities of light pulses radiated on said substrate; and an adjusting system which adjusts an intensity of said next light pulse based on the measured integrated light quantities.

2. An apparatus according to claim 1, wherein said illumination system has a light source which radiates said light pulses, and said adjusting system includes a device which adjusts a voltage applied to said light source to vary intensity of the light pulses.

3. An apparatus according to claim 1, wherein said measurement system includes a photoelectric detector for receiving a portion of each light pulse and a calculator for calculating individual integrated light quantities radiated each of said plurality of partial regions, respectively based on a signal from said photoelectric detector and for determining the intensity of said next pulse based on the calculated integrated light quantities.

4. An apparatus according to claim 3, wherein said illumination system includes an optical integrator for reducing non-uniformity in illuminance of each light pulse on said mask and an optical member for guiding a portion of each light pulse from said optical integrator to said photoelectric detector.

5. An apparatus according to claim 1, further comprising a controller which detects a difference between at least one of said integrated light quantities and a target exposure dose corresponding thereto, the controller suspending said scanning exposure when said difference exceeds a predetermined value.

6. A scanning exposure apparatus comprising:

an illumination system for illuminating a mask with light pulses;

a projection optical system receiving light pulses from said mask and having an image field which is smaller than an exposure region on a photosensitive substrate, in which region an image of a pattern on said mask is to be formed by light pulses radiated from said projection optical system;

a scanning system which synchronously scans said mask and said substrate relative to said projection optical system for scanning exposure; and a measurement system which measures, during the scanning exposure, individual integrated light quantities radiated on each of a plurality of partial regions, respectively, in said exposure region, within the image field to be irradiated with a next light pulse, based on intensities of light pulses radiated on said substrate;

wherein an intensity of said next light pulse is determined based on the measured integrated light quantities.

7. A scanning exposure apparatus comprising:

an illumination system for illuminating a mask with light pulses;

a scanning system which synchronously scans said mask and a substrate for scanning exposure; and a measurement system, including a photoelectric detector which receives a portion of each light pulse and which measures, each time a predetermined number of pulses are radiated on the mask during the scanning exposure, individual integrated light quantities radiated on each of a plurality of partial regions in an exposure region, respectively, on the substrate on which an image of a pattern on the mask is formed by light pulses from the mask, based on a signal from said photoelectric detector.

8. An apparatus according to claim 7, further comprising an adjusting system for adjusting, during the scanning exposure, intensity of a light pulse based on the measured integrated light quantities.

9. An apparatus according to claim 8, wherein said illumination system has a light source which radiates said light pulses, and said adjusting system includes a device which adjusts a voltage applied to said light source to vary intensity of a light pulse.

10. An apparatus according to claim 7, further comprising a projection optical system receiving light pulses from the mask for projecting the image of the pattern of the mask onto said substrate, the projection optical system having a rectangular image field which is smaller than a size of said exposure region.

11. An apparatus according to claim 7, further comprising a controller which detects a difference between at least one of the measured integrated light quantities and a target exposure dose corresponding thereto, the controller suspending said scanning exposure when said difference exceeds a predetermined value.

12. A scanning exposure apparatus comprising:

an illumination system for irradiating a mask with light pulses;

a scanning system which synchronously scans the mask and a photosensitive substrate for scanning exposure, so that an image of a pattern on the mask is formed by light pulses from the mask on a plurality of small regions in an exposure region on the photosensitive substrate during the scanning exposure, wherein, during said scanning exposure individual integrated light quantities radiated on each of said plurality of small regions vary among said plurality of small regions; and a measurement system which measures, each time a predetermined number of pulses are radiated on the mask during the scanning exposure, each of the individual integrated light quantities radiated on said plurality of small regions, respectively.

13. A scanning exposure apparatus comprising:

an illumination system for illuminating a mask with light pulses;

a projection optical system receiving light pulses from said mask and having an image field which is smaller than a size of an exposure region on a photosensitive substrate, in which region an image of a pattern on said mask is to be formed by light pulses radiated from said projection optical system;

a scanning system which synchronously scans said mask and said substrate relative to said projection optical system for scanning exposure, wherein, during said scanning exposure, individual integrated light quantities radiated on each of a plurality if small regions in said exposure region within said image field vary among said plurality of small regions; and an adjusting system which adjusts intensity of said light pulses in accordance with the individual integrated light quantities radiated on each of the plurality of small regions, respectively.

14. A method for scanningly exposing an exposure region on a photosensitive substrate with an image of a pattern on a mask, utilizing light pulses irradiating the mask and projected from the mask to the substrate by a projection optical system, the exposure region being larger than an image field of the projection optical system, comprising the steps of:

synchronously scanning said mask and said substrate relative to said projection optical system for scanning exposure, wherein, during said scanning exposure, individual integrated light quantities radiated on each of a plurality of small regions is said exposure region within said image field vary among said plurality of small regions; measuring, each time a predetermined number of pulses are radiated on the mask during the scanning exposure, each of the individual integrated light quantities radiated on said plurality of small regions, respectively; and adjusting an energy amount of a next light pulse to be radiated on the substrate based on measured integrated light quantities.

15. A method according to claim 14, wherein a voltage applied to a light source which radiates aid light pulses is adjusted so that an energy amount of a light pulse is varied.

16. A method according to claim 14, further comprising the step of:

suspending said scanning exposure, when a difference between at least one of said integrated light quantities and a target exposure dose corresponding thereto exceeds a predetermined value.

17. A scanning exposure method comprising the steps of:

synchronously scanning a mask and a substrate relative to a projection optical system so to scanningly expose an exposure region on the substrate with an image of a pattern on a mask, utilizing light pulses irradiating the mask, the exposure region being larger than an image field of the projection optical system, wherein, during a scanning exposure, individual integrated light quantities radiated on a plurality of small regions in said exposure region within said image field vary among said plurality of small regions; and measuring, each time a predetermined number of pulses are radiated on the mask during the scanning exposure, each of the individual integrated light quantities radiated on said plurality of small regions, respectively.

18. A method according to claim 17, further comprising the step of:

adjusting an energy amount of a next light pulse to be radiated onto said substrate, when a difference between at least one of said integrated light quantities and a target integrated light quantity corresponding thereto exceeds a predetermined value.

19. A method according to claim 17, further comprising the step of:

suspending said scanning exposure, when a difference between at least one of said integrated light quantities and a target exposure dose corresponding thereto exceeds a predetermined value.

20. A method according to claim 17, further comprising the step of:

determining intensity of a next light pulse for irradiating said mask in accordance with differences between the individual measured integrated light radiated quantities on each of said plurality of small regions and target integrated light quantities respectively corresponding thereto.

21. A scanning exposure method comprising the steps of:

synchronously scanning a mask and a substrate relative to a projection optical system so as to scanningly expose an exposure region on the substrate with an image of a pattern on the mask, utilizing light pulses irradiating the mask during a scanning exposure, the exposure region being larger than an image field of the projection optical system,; and adjusting an energy amount of a next light pulse to be radiated onto said substrate in accordance with individual integrated light quantities radiated on each of a plurality of small regions, respectively, in said exposure region within said image field during the scanning exposure.

* * * * *